United States Patent [19]

Andrieu et al.

[11] Patent Number: 5,481,606
[45] Date of Patent: Jan. 2, 1996

[54] OPTO-COUPLING DEVICE BETWEEN A MODEM AND A TELEPHONE LINE

[75] Inventors: Dominique Andrieu, Golfe-Juan; Innocenzo Francione, Antibes, both of France

[73] Assignee: Rockwell International Corporation, Seal Beach, Calif.

[21] Appl. No.: 213,353

[22] Filed: Mar. 15, 1994

[30]   Foreign Application Priority Data

Apr. 9, 1993 [FR] France ................................. 93 04481

[51] Int. Cl.$^6$ ................................................. H04M 1/00
[52] U.S. Cl. ................................... 379/399; 379/405
[58] Field of Search ................................. 379/443, 345, 379/402, 399, 398, 405

[56]   References Cited

U.S. PATENT DOCUMENTS 5,245,654  9/1993  Wilkison et al. ..................... 379/345

*Primary Examiner*—Jeffery A. Hofsass
*Assistant Examiner*—Jack Chiang
*Attorney, Agent, or Firm*—George A. Montanye; Charles T. Silberberg; Tom Streeter

[57]   ABSTRACT

An opto-coupling device lies between an analog input circuit, such as a telephone line, and a processing apparatus, such as a modem. The device has a high impedance circuit; this is, its impedance is high with respect to the input impedance of the analog input circuit. This high impedance circuit has a voltage/current conversion circuit. The variations of the current flowing through the conversion circuit are directly induced by the variations in the voltage of the analog input signal. The high impedance circuit is in series with a constant current source, and is connected to the analog input circuit. The inputs of the opto-coupling device are in parallel with the voltage/current conversion circuit.

18 Claims, 2 Drawing Sheets

OPTO-COUPLING DEVICE BETWEEN A MODEM AND A TELEPHONE LINE

BACKGROUND OF THE INVENTION

1. Field of the Invention

The present invention relates to devices for reception of analog signals of the telephonic type, and in particular an opto-coupling device between an input circuit for analog signals of the telephonic type and an apparatus for signal processing such as a modem.

2. Description of the Prior Art

Information is more and more often transmitted over public network telephone lines, on which digital data are sent after having been converted to analog form thru an apparatus for signal processing such as a modem. On the receive side, analog signals incoming from the telephone line are converted back into digital data thru another modem.

Modems are relatively complex systems which require their own power supply coming from the AC central power. This can result in a dangerous situation in case of bad electrical contact on the telephone line which is powered from the central telephone branch exchange with a DC voltage (48 V in general) modulated by the transmitted analog signals. This is the reason why current regulations impose a coupling with no metallic contact between the telephone line and the apparatus for signal processing such as a modem, which is supplied by AC central power.

The known way of complying with the regulations is then to implement a transformer as interface between the telephone line and the modem. But it is very difficult to come up with transformers of a miniaturised size in proportion with the rest of electronic circuits which have also more and more reduced in size thanks to technological advancement in the last ten years, the ultimate goal being to integrate all line interface circuitry on a card the size of which complies with the PCMCIA (Personal Computer Memory Card International Association) standard, which is the size of a memory card, or a credit card.

One has then envisaged to utilise an opto-coupling system where electric current variations of the analog signal are applied to a light emitting diode (LED) which transforms them into light emission variations. The latter light emission then activates a phototransistor the output current of which varies according to the received light flow and therefore according to the variations of the analog signal.

Unfortunately, it proves impossible to use a diode of the LED type directly connected to the input circuitry for the analog signal. Indeed, the diode has a low impedance and a direct connection to the input circuitry would result in a drop of the input impedance of the telephone line which, for line adaptation reasons, needs stay at a constant value of generally 600 ohms, or any other value according to national regulations.

SUMMARY OF THE INVENTION

It is therefore an object of the invention to allow the coupling between the input circuit of a telephone line and an apparatus for signal processing using an opto-coupler, still sticking to a high input impedance conforming to regulations.

Another object of the invention is yet to allow the coupling between the input circuit of a telephone line and a processing apparatus such as a modem using an opto-coupler in which variations of the current flowing thru a light emitting diode depend on the variations of analog signal voltage at the input circuit of the telephone line.

The main object of the invention lies then in an opto-coupling device between an input circuit of analog signal such as telephone line signal, and a processing apparatus for said analog signal such as a modem, comprising a circuit having a high impedance with respect to the input impedance of the input circuit of the analog signal, the high impedance circuit comprising a voltage/current conversion circuit thru which flows a current the variations of which are directly induced by the variations of voltage for said analog signal, and which is in series with a constant current source, and being connected to said analog signal input circuit, the inputs of said opto-coupling device being in parallel with said voltage/current conversion circuit.

Thus, because the current source imposes a constant total current in the high impedance circuit, current variations at the inputs of the opto-coupling device are equal in absolute value to the current variations in the voltage/current conversion circuit and are therefore directly related to the voltage variations of the analog signal at the input circuit.

Goals, objects and characteristics of the present invention will be better understood from the following description in conjunction with the drawings in which:

DETAILED DESCRIPTION OF THE PREFERRED EMBODIMENT

Figure 1:
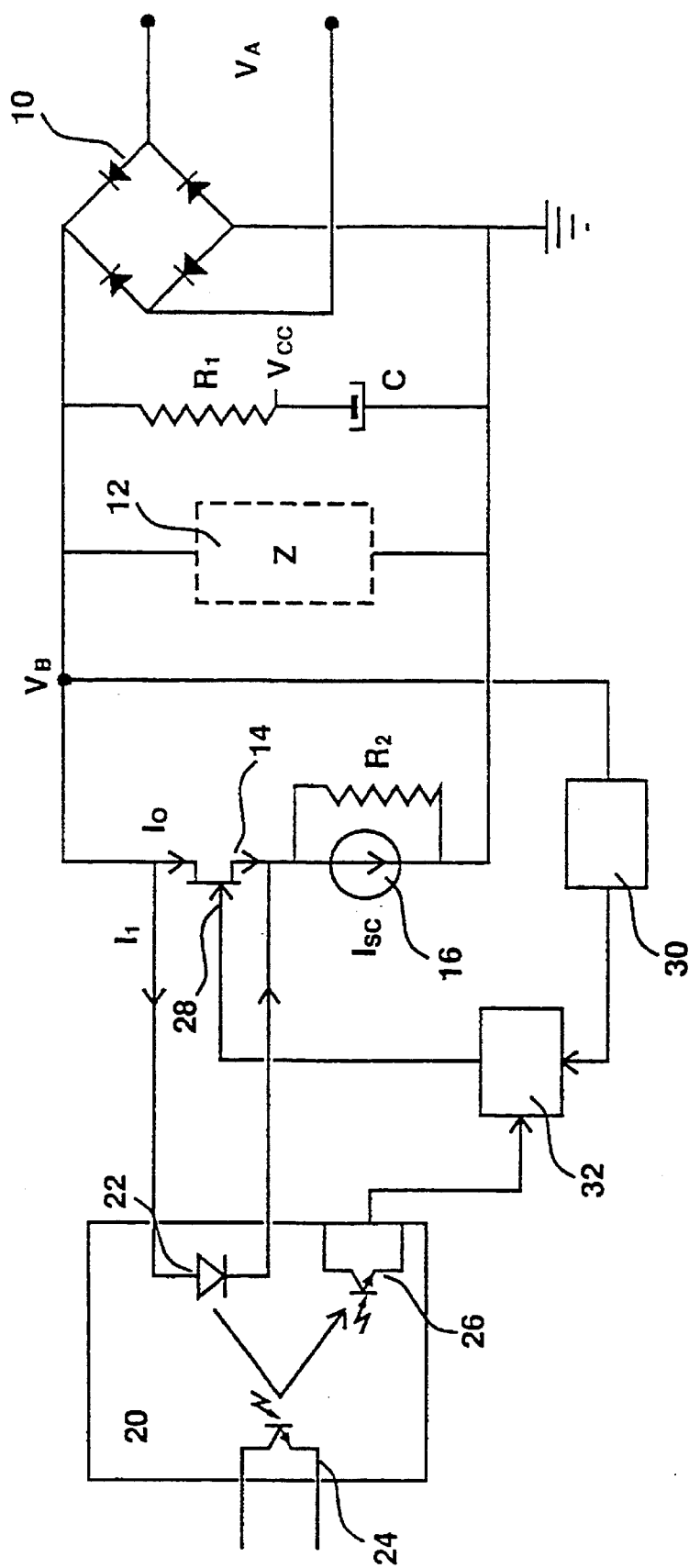
FIG. 1 is a synoptic presentation of the coupling system according to the invention.

As seen FIG. 1, the analog line inputs an input voltage Va. The latter voltage results from the DC voltage provided by the central switch (48 V) on the line to the input circuit represented on FIG. 1. The voltage Va is modulated by the analog signal resulting for example from digital data transmitted originally by a remote MOdulator-DEModulator (MODEM).

Since polarity of the telephone line inputs cannot be distinguished, a diode rectifier 10 allows rectifying of the input voltage in case of connection inadvertent swapping, by always keeping a positive voltage Vb at the output of diode rectifier 10.

Between Vb voltage and the ground, a circuit composed of a resistor R1 of approximately 600 ohms in series with a capacitor C with a high value (around 10 uF) allows to obtain a 600 ohms impedance value at the input of the telephone line thus conforming to current regulations. The latter circuit derives a maximum current of 1 mA whereas DC current received at the input of the telephone line has a total intensity of between around 20 mA and around 100 mA, depending on how long of a line it is between the system and the central switch. Voltage Vcc at the junction between resistor R1 and capacitor C also powers the active circuits such as amplifiers used in the system.

An impedance (Z) 12 shown in dotted lines on FIG. 1, of a high value compared to 600 ohms (for example 20 kohms), is used for regulation by absorbing the DC component of voltage Vb and at the same time being of little impact on the 600 ohms input impedance.

Finally, voltage Vb also powers a circuit comprising a field effect transistor 14 in series with a current source 16. Source current 16 features a high impedance represented by the resistor in parallel R2, and provides a constant current Isc. In fact, when connection is established with the telephone line, current received from the line reaches a given value between 20 mA and 100 mA (for example 60 mA), and current source 16 then provides a constant current Isc depending on the value of the current from the telephone line. High impedance 12 sinks most of this current, and a current Isc of around 10 mA flows thru current source 16.

Between the source and drain of field effect transistor 14 is connected a light emitting diode 22 belonging to an opto-coupling device 20. Light emitted by the diode 22 activates the gates of two phototransistors 24 and 26. Variations of current flowing thru light emitting diode 22 are thus transformed into variations of current flowing thru phototransistor 26 the role of which will be detailed further. The current available at the outputs of phototransistor 24 serves as input signal to a modem (not shown) or any other signal processing piece of equipment, enabling to realise opto-coupling between the input circuit for the telephone line and the modem.

Constant current Isc provided by the current source is the sum of I0 flowing thru field effect transistor 14 and I1 thru light emitting diode 22:

$$Isc = I0 + I1$$

Thus variations of I0 and I1 are such that:

$$\Delta(I0) + \Delta(I1) = 0$$

It is then sufficient to command gate 28 of field effect transistor 14 thru the variations of voltage Vb for obtaining proportional variations of current I0 ( the field effect transistor acting as a simple voltage/current conversion circuit) and thus proportional variations of current I1 since:

$$\Delta(I1) = -\Delta(I0)$$

As shown FIG. 1, voltage Vb is not applied directly to gate 28 of field effect transistor 14, but thru an amplifier 30 and a servo-command circuit 32. The servo-command is besides controlled by a reaction signal provided by phototransistor 26 of opto-coupling device 20 which is exposed to the same light as phototransistor 24, i.e. The light emitted by the light-emitting diode 22 reflecting variations of voltage Vb.

High value impedance 12 has been represented in dotted lines on FIG. 12 since the latter impedance is not absolutely mandatory in the invention as the circuit comprising field effect transistor 14 and current source 16 has a high impedance and is therefore equivalent to impedance 12. This impedance is provided by the parasitic impedance of the current source itself and represented by R2 on FIG. 1. Such an impedance is of around 20 kohms.

One sees that the system described above realises the coupling between the input circuit for telephone line and an apparatus for processing of the signal received on the line thanks to an opto-coupling device, thus without any current conducting connection, but still featuring an input impedance complying with regulations.

Figure 2:
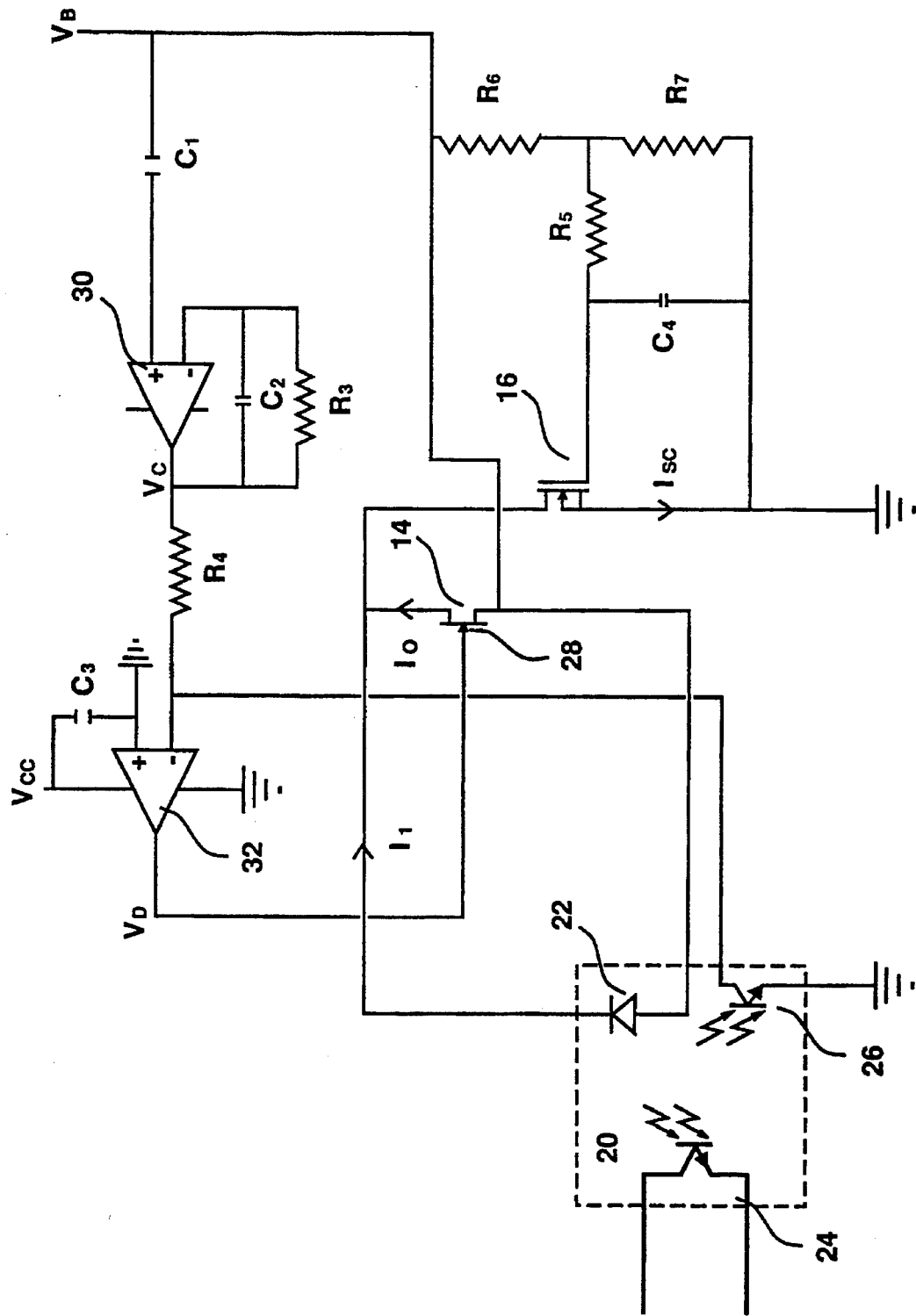
FIG. 2 is the representation of a preferred embodiment of the coupling system according to the invention.

FIG. 2 represents an example of practical embodiment of the device according to the invention. As shown on that figure, voltage Vb obtained after possible rectifying thru diode rectifier 10 (see FIG. 1), is applied to input of amplifier 30 thru capacitor C1. Capacitor C1 having for example a value of 470 nF allows to let thru only the AC component of voltage Vb applied to input + of amplifier 30. Amplifier 30 has a feedback loop composed of capacitor C2 (approximate value of 100 pF) in parallel with resistor R3 (possible value of 56 kohms). It provides an amplified signal Vc on its output.

Voltage Vc is then applied, thru resistor R4, at the input of servo-command circuit 32 which is, in the preferred embodiment of the invention, an operational amplifier powered by voltage Vcc, and having a capacitor C3 (value of 100 pF) between power voltage Vcc and the positive input + connected to the ground so as to avoid oscillations. One must note that amplifier 30 has the same power and anti-oscillation circuitry although not shown on the figure.

Output Vd of the servo-command circuit 32 is applied to gate 28 of the field effect transistor 14, which is connected on one side to voltage Vb, and on the other side to current source 16 which is here a field effect transistor which source and substrate are grounded and represents a parasitic impedance of around 20 kohms. The field effect transistor making up current source 16 is biased by resistors R5, R6, R7 and capacitor C4 in the following manner. Resistors R6 and R7 together in series, of respective values 220 kohms and 100 kohms, form a voltage divider between Vb and the ground. Resistor R5 has a relatively high value of 1 Mohms and capacitor C4 also has a relatively high value of around 470 nF, therefore giving the R5-C4 circuit a high time constant. Consequently, only the DC component of the signal present at the connection between R5, R6 and R7 is fed to the gate of the field effect transistor or current source 16. One thus obtains a constant current Isc flowing between drain and source of the field effect transistor since the DC component fed to the gate is constant.

As seen FIG. 2, the light-emitting diode of opto-coupling device 20 shown in dotted lines on the figure, is connected between drain and source of field effect transistor 14, so that I1 current variations light-emitting diode 22 correspond to the I0 current variations in field effect transistor 14, because the sum of the latter currents is the constant current Isc flowing thru current source 16.

One will note that a device being possibly used as opto-coupling coupling device 20 on FIG. 2 is sold by SIEMENS under reference 'IL 300 Linear Coupler'.

In the implementation example shown FIG. 2, constant current Isc provided by current source 16 could be of 60 mA, I0 current flowing thru field effect transistor 14 having then an average value of 50 mA and I1 current flowing thru light-emitting diode 22 having an average value of 10 mA.

Control exerted by servo-command circuit 32 is explained as follows with reference to FIG. 2.

When voltage Vc applied to input of amplifier 32 rises, output voltage Vd decreases because the voltage difference between the two inputs decreases. Decreasing Vd voltage being applied on gate 28 of field effect transistor 14, the latter does not let as much current thru and I0 decreases. As seen above, the decrease of I0 leads to an increase I1 of identical amount. Therefore, since current flowing thru light-emitting diode 22 increases, light emitted by the latter also increases. Firstly, the light commands phototransistor 24 connected to modem input, and the increase in light leads to an increase in the input current of the modem directly related to the variations of analog signal received from the telephone line. Secondly, light emitted by diode 22 also commands phototransistor 26, which, as already mentioned, has identical characteristics (he can for example be manufactured on the same silicon chip) as those of phototransistor 24, although it can dissipate less power. As light increases from the increase of current flowing thru diode 22, current flowing thru phototransistor 26 increases too. Voltage at resistor R4 therefore increases as much as decreases the voltage input to amplifier 32, which tends to increase the voltage difference at the inputs of amplifier 32. Consequently, amplifier 32 indeed acts as a servo-command thanks to the reaction signal provided by phototransistor 26.

Although the coupling system according to the invention has been illustrated in a particular embodiment where the signal received from the telephone line feeds a modem, it will be obvious that any other apparatus for signal processing could be used in place of the modem, such as an answering machine or an alarm system.

We claim:

1. A coupling system between:
   (a) an input circuit for an analog telephone line voltage signal (Va), said signal having a DC component, and
   (b) an analog signal processing apparatus comprising a modem, said coupling system comprising an opto-coupling device (20) having an input and an output, said input of the opto-coupling device having an input impedance, and said output of the opto-coupling device having an output impedance,
      (1) the input of the opto-coupling device being connected to said input circuit for analog signal, and
      (2) the output of the opto-coupling device being connected to said signal processing apparatus,
   wherein:
   (c) said coupling system comprises a circuit of high impedance relative to an input impedance of said analog signal processing apparatus, said high impedance circuit comprising a voltage-to-current conversion circuit (14) wherein:
      (1) a current (I0) having variations (I1) flows through said conversion circuit, said variations being induced by variations of voltage (Vb) of said analog signal,
      (2) said conversion circuit is in series with a constant current source (16), said current source (16) comprises a field effect transistor with high impedance (R2), said conversion circuit having a field effect transistor having a gate (28) which is fed by the DC component of said analog signal, and
      (3) said conversion circuit is connected to said analog signal circuit, and
   (d) inputs of said opto-coupling device are in parallel with said voltage-to-current conversion circuit, whereby the current variations (I1) at the input of said opto-coupling device, being equal in absolute value to the variations of current in said voltage-to-current conversion circuit, are proportional to the variations of the voltage of the analog telephone line signal on said input circuit.

2. The system according to claim 1 in which the gate of said field effect transistor of the conversion circuit (14) being commanded by the voltage variations (Vb) on said analog signal input circuit.

3. The system according to claim 1, timber comprising a servo-command circuit (32) providing for the variations of voltage (Vb) at an input of said voltage-to-current conversion circuit, wherein:
   (a) said conversion circuit has an analog signal input circuit connected to (Vb),
   (b) said analog signal input circuit is controlled by a reaction signal, and
   (c) said reaction signal varies according to the signal provided to the opto-coupling device (20).

4. The system according to claim 2, further comprising a servo-command circuit (32) providing for the variations of voltage (Vb) at an input of said voltage-to-current conversion circuit, wherein:
   (a) said conversion circuit has an analog signal input circuit connected to (Vb),
   (b) (b) said analog signal input circuit is controlled by a reaction signal, and
   (c) said reaction signal varies according to the signal provided to the opto-coupling device (20).

5. The system according to claim 3 in which said opto-coupling device (20) further comprises:
   (a) a first phototransistor (24) having an output current which varies according to the signal input to said opto-coupling device, and
   (b) a second phototransistor (26) providing for said reaction signal aimed at controlling an input voltage of said servo-command circuit (32).

6. The system according to claim 4 in which said opto-coupling device (20) further comprises:
   (a) a first phototransistor (24) having an output current which varies according to the signal input to said opto-coupling device, and
   (b) a second phototransistor (26) providing for said reaction signal aimed at controlling an input voltage of said servo-command circuit (32).

7. The system according to claim 3, in which said servo-command circuit (32) comprises an amplifier having an input which receives:
   (a) the voltage variations (Vb) of said analog signal, together with
   (b) said reaction signal coming from said opto-coupling device (20).

8. The system according to claim 4, in which said servo-command circuit (32) comprises an amplifier having an input which receives:
   (a) the voltage variations (Vb) of said analog signal, together with
   (b) said reaction signal coming from said opto-coupling device (20).

9. The system according to claim 5, in which said servo-command circuit (32) comprises an amplifier having an input which receives:
   (a) the voltage variations (Vb) of said analog signal, together with
   (b) said reaction signal coming from said opto-coupling device (20).

10. The system according to claim 6, in which said servo-command circuit (32) comprises an amplifier having an input which receives:
    (a) the voltage variations (Vb) of said analog signal, together with
    (b) said reaction signal coming from said opto-coupling device (20).

11. The system according to claim 3, in which said servo-command circuit (32) has its input connected to an output of an amplifier (30), said amplifier having an input which is connected to the analog signal input circuit so as to amplify the variations of said signal (Vb).

12. The system according to claim 4, in which said servo-command circuit (32) has its input connected to an output of an amplifier (30), said amplifier having an input which is connected to the analog signal input circuit so as to amplify the variations of said signal (Vb).

13. The system according to claim 5, in which said servo-command circuit (32) has its input connected to an output of an amplifier (30), said amplifier having an input which is connected to the analog signal input circuit so as to amplify the variations of said signal (Vb).

14. The system according to claim 6, in which said servo-command circuit (32) has its input connected to an output of an amplifier (30), said amplifier having an input which is connected to the analog signal input circuit so as to amplify the variations of said signal (Vb).

15. The system according to claim 7, in which said servo-command circuit (32) has its input connected to an output of an amplifier (30), said amplifier having an input which is connected to the analog signal input circuit so as to amplify the variations of said signal (Vb).

16. The system according to claim 8, in which said servo-command circuit (32) has its input connected to an output of an amplifier (30), said amplifier having an input which is connected to the analog signal input circuit so as to amplify the variations of said signal (Vb).

17. The system according to claim 9, in which said servo-command circuit (32) has its input connected to an output of an amplifier (30), said amplifier having an input which is connected to the analog signal input circuit so as to amplify the variations of said signal (Vb).

18. The system according to claim 10, in which said servo-command circuit (32) has its input connected to an output of an amplifier (30), said amplifier having an input which is connected to the analog signal input circuit so as to amplify the variations of said signal (Vb).

* * * * *